(12) United States Patent
Masuoka et al.

(10) Patent No.: US 8,026,141 B2
(45) Date of Patent: Sep. 27, 2011

(54) METHOD OF PRODUCING SEMICONDUCTOR

(75) Inventors: Fujio Masuoka, Tokyo (JP); Shintaro Arai, Tokyo (JP)

(73) Assignee: Unisantis Electronics (Japan) Ltd., Tokyo (JP)

( * ) Notice: Subject to any disclaimer, the term of this patent is extended or adjusted under 35 U.S.C. 154(b) by 44 days.

(21) Appl. No.: 12/703,980

(22) Filed: Feb. 11, 2010

(65) Prior Publication Data

US 2010/0197048 A1 Aug. 5, 2010

Related U.S. Application Data

(63) Continuation of application No. PCT/JP2009/052144, filed on Feb. 9, 2009.

(60) Provisional application No. 61/207,554, filed on Feb. 13, 2009.

(30) Foreign Application Priority Data

Feb. 8, 2008 (WO) .................. PCT/JP2008/052150

(51) Int. Cl.
*H01L 21/336* (2006.01)

(52) U.S. Cl. .................... 438/268; 438/585; 438/692

(58) Field of Classification Search .................. 438/268, 438/585, 692

See application file for complete search history.

(56) References Cited

U.S. PATENT DOCUMENTS 7,115,476 B1 * 10/2006 Izumida .................. 438/268
2004/0266077 A1 * 12/2004 Yeo et al. .................. 438/157

FOREIGN PATENT DOCUMENTS

| JP | 62-296425 A | 12/1987 |
|----|-------------|---------|
| JP | 63-192236 A | 8/1988 |
| JP | 02-188966 A | 7/1990 |
| JP | 03-152925 A | 6/1991 |
| JP | 04-370929 A | 12/1992 |
| JP | 05-291184 A | 11/1993 |
| JP | 07-245291 A | 9/1995 |

(Continued)

OTHER PUBLICATIONS

Li, Ruigang et al., 50 nm Vertical Surround Gate MOSFET with S-factor of 75mV/dec, Device Research Conference, 2001, pp. 63-64.

International Search Report for International Application No. PCT/JP2008/052150, dated May 13, 2008, 2 pages.

(Continued)

*Primary Examiner* — Thanh V Pham
*Assistant Examiner* — Marvin Payen
(74) *Attorney, Agent, or Firm* — Brinks Hofer Gilson & Lione

(57) ABSTRACT

In a conventional SGT production method, during dry etching for forming a pillar-shaped silicon layer and a gate electrode, an etching amount cannot be controlled using an end-point detection process, which causes difficulty in producing an SGT while stabilizing a height dimension of the pillar-shaped silicon layer, and a gate length. In an SGT production method of the present invention, a hard mask for use in dry etching for forming a pillar-shaped silicon layer is formed in a layered structure comprising a first hard mask and a second hard mask, to allow the end-point detection process to be used during the dry etching for the pillar-shaped silicon layer. In addition, a gate conductive film for use in dry etching for forming a gate electrode is formed in a layered structure comprising a first gate conductive film and a second gate conductive film, to allow the end-point detection process to be used during the dry etching for the gate electrode.

3 Claims, 21 Drawing Sheets

FOREIGN PATENT DOCUMENTS

| | | |
|---|---|---|
| JP | 10-209128 A | 8/1998 |
| JP | 2006-310651 A | 11/2006 |

OTHER PUBLICATIONS

Written Opinion of the International Searching Authority for International Application No. PCT/JP2008/052150, dated May 13, 2008, 5 pages.

International Search Report for International Application No. PCT/JP2009/052144, dated May 19, 2009, 2 pages.

Written Opinion of the International Searching Authority for International Application No. PCT/JP2009/052144, dated May 19, 2009, 5 pages.

* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

METHOD OF PRODUCING SEMICONDUCTOR

RELATED APPLICATIONS

Pursuant to 35 U.S.C. §119(e), this application claims the benefit of the filing date of Provisional U.S. Patent Application Ser. No. 61/207,554 filed on Feb. 13, 2009. This application is a continuation application of PCT/JP2009/052144 filed on Feb. 9, 2009 which claims priority under 35 U.S.C. §365(a) to PCT/JP2008/052150 filed on Feb. 8, 2008. The entire contents of these applications are hereby incorporated by reference.

BACKGROUND OF THE INVENTION

1. Field of the Invention

The present invention relates to a production method for a semiconductor device, and more particularly to a production method for an SGT (Surrounding Gate Transistor) which is a vertical MOS transistor comprising a pillar-shaped semiconductor layer having a sidewall serving as a channel region, and a gate electrode formed to surround the channel region.

2. Description of the Related Art

With a view to achieving higher integration and higher performance of a semiconductor device, an SGT (Surrounding Gate Transistor) has been proposed which is a vertical transistor comprising a pillar-shaped semiconductor layer formed on a surface of a semiconductor substrate, and a gate formed to surround a sidewall of the pillar-shaped semiconductor layer (see, for example, the following Patent Document 1: JP 2-188966A). In the SGT, a drain, a gate and a source are arranged in a vertical direction, so that an occupancy area can be significantly reduced as compared with a conventional planar transistor.

FIG. 20(a) shows a top plan view of a CMOS inverter constructed using the SGT disclosed in the Patent Document 1, and FIG. 20(b) is a sectional view taken along the cutting-plane line A-A' in the top plan view of FIG. 20(a).

Referring to FIGS. 20(a) and 20(b), an N-well 302 and a P-well 303 are formed in an upper region of a Si substrate 301. A pillar-shaped silicon layer 305 constituting a PMOS (PMOS pillar-shaped silicon layer 305) and a pillar-shaped silicon layer 306 constituting an NMOS (NMOS pillar-shaped silicon layer 306) are formed on a surface of the Si substrate, specifically, on respective ones of the N-well region and the P-well region, and a gate 308 is formed to surround the pillar-shaped silicon layers. Each of a P+ drain diffusion layer 310 formed underneath the PMOS pillar-shaped silicon layer, and a N+ drain diffusion layer 312 formed underneath the NMOS pillar-shaped silicon layer, is connected to an output terminal Vout. A source diffusion layer 309 formed on a top of the PMOS pillar-shaped silicon layer is connected to a power supply potential Vcc, and a source diffusion layer 311 formed on a top of the NMOS pillar-shaped silicon layer is connected to a ground potential Vss. The common gate 308 for the PMOS and the NMOS is connected to an input terminal Vin. In this manner, the CMOS inverter is formed.

A process flow as one example of an SGT production method is disclosed in the following Non-Patent Document 1. FIGS. 21(a) to 21(h) schematically show the process flow for forming a pillar-shaped silicon layer and a gate electrode of an SGT, in the Non-Patent Document 1. With reference to FIGS. 21(a) to 21(h), the process flow will be described below. As shown in FIG. 21(b), a silicon substrate 402 illustrated in FIG. 21(a) is prepared, and etched to form a pillar-shaped silicon layer 403. Then, as shown in FIG. 21(c), a gate dielectric film 404 is formed. Then, as shown in FIG. 21(d), a gate conductive film 405 is formed. Then, as shown in FIG. 21(e), the gate conductive film 405, and a portion of the gate dielectric film 404 on a top of the pillar-shaped silicon layer, are polished by chemical mechanical polishing (CMP). Then, as shown in FIG. 21(f), the gate conductive film 405 is etched back to allow the gate conductive film 405 surrounding the pillar-shaped silicon layer to have a desired gate length. Then, as shown in FIG. 21(g), a resist 406 for a gate line pattern is formed by lithography. Then, as shown in FIG. 21(h), the gate conductive film 405 is etched to form a gate electrode and a gate line.

However, the SGT production method illustrated in FIGS. 21(a) to 21(h) has the following problems.

Firstly, in the above process flow, dry etching for the pillar-shaped silicon layer has to be performed under etching conditions including a designated etching time, because it is unable to employ an end-point detection process based on monitoring of a change in plasma emission intensity. In this case, a height dimension of the pillar-shaped silicon layer is directly influenced by an etching rate of an etching apparatus during an etching operation, so that it will considerably fluctuate. In an SGT, a fluctuation in height dimension of a pillar-shaped silicon layer has a direct impact on a fluctuation in channel length, which causes a considerable fluctuation in transistor characteristics.

Secondly, in the above process flow, dry etching for a gate electrode also has to be performed under etching conditions including a designated etching time, because it is unable to employ the end-point detection process based on monitoring of a change in plasma emission intensity. In this case, a gate length is directly influenced by an etching rate of an etching apparatus during an etching operation, so that it will considerably fluctuate. The fluctuation in gate length inevitably causes a considerable fluctuation in transistor characteristics.

Thus, in the above SGT production method, due to considerable influence of the etching rate during the etching operation on the height dimension and the gate length of the pillar-shaped silicon layer, it is extremely difficult to minimize a fluctuation in transistor characteristics between wafers or production lots.

In view of the above circumstances, it is an object of the present invention to produce a semiconductor device while stabilizing a height dimension of a pillar-shaped semiconductor layer, and a gate length, by using an end-point detection process based on monitoring of a plasma emission intensity, during dry etching for forming the pillar-shaped semiconductor layer and during dry etching for setting the gate length.

Patent Document 1: JP 2-188966A

Non-Patent Document 1: Ruigang Li, et al., "50 nm Vertical Surrounding Gate MOSFET with S-Factor of 75 mV/dec", Device Research Conference, 2001, p. 63

SUMMARY OF THE INVENTION

In order to produce a semiconductor device while stabilizing a height dimension of a pillar-shaped semiconductor layer, according to a first aspect of the present invention, there is provided a method of producing a semiconductor device in which a source diffusion layer, a drain diffusion layer and a pillar-shaped semiconductor layer are vertically arranged on an upper side of a substrate in a layered manner, and a gate is arranged around a sidewall of the pillar-shaped semiconductor layer. The method comprises: providing a first protective film arranged on a semiconductor substrate, and a second protective film arranged on the first protective film, wherein the second protective film has a plasma emission characteristic different from that of the first protective film, and the first and second protective films are patterned in a pillar shape on the semiconductor substrate; and etching the semiconductor substrate using the first and second protective films as a mask to allow a part of the semiconductor substrate to be formed as a pillar-shaped silicon layer, wherein an intensity of plasma emission generated from the second protective film is monitored during the etching to detect a change in the plasma emission intensity occurring when the second protective film is etched away, to thereby detect an end-point of the etching for the pillar-shaped silicon layer.

Preferably, in the method of the present invention, the second protective film is made of polysilicon or amorphous silicon.

In order to produce a semiconductor device while stabilizing a gate length, according to a second aspect of the present invention, there is provided a method of producing a semiconductor device in which a source diffusion layer, a drain diffusion layer and a pillar-shaped semiconductor layer are vertically arranged on an upper side of a substrate in a layered manner, and a gate is arranged around a sidewall of the pillar-shaped semiconductor layer, wherein the pillar-shaped semiconductor layer is arranged on a semiconductor substrate, and a dielectric film is arranged on respective surfaces of the semiconductor substrate and the pillar-shaped semiconductor layer. The method comprises the steps of: forming a first gate conductive film to cover a surface of the dielectric film; forming, on a surface of the first gate conductive film, a second gate conductive film having a plasma emission characteristic different from that of the first gate conductive film; flattening respective upper portions of the first and second gate conductive films; and anisotropically etching the first and second gate conductive films, wherein an intensity of plasma emission generated from the second gate conductive film is monitored during the etching to detect a change in the plasma emission intensity occurring when the second gate conductive film is etched away, to thereby detect an end-point of the etching for the first and second gate conductive films.

In order to produce a semiconductor device while stabilizing a gate length, according to a third aspect of the present invention, there is provided a method of producing a semiconductor device in which a source diffusion layer, a drain diffusion layer and a pillar-shaped semiconductor layer are vertically arranged on an upper side of a substrate in a layered manner, and a gate is arranged around a sidewall of the pillar-shaped semiconductor layer, wherein the pillar-shaped semiconductor layer is arranged on a semiconductor substrate, and a dielectric film is arranged on respective surfaces of the semiconductor substrate and the pillar-shaped semiconductor layer. The method comprises the steps of: forming a first gate conductive film to cover a surface of the dielectric film; forming, on a surface of the first gate conductive film, a second gate conductive film having a plasma emission characteristic different from that of the first gate conductive film; forming, on a surface of the second gate conductive film, a third gate conductive film having a plasma emission characteristic different from that of the second gate conductive film; flattening respective upper portions of the first, second and third gate conductive films; and anisotropically etching the first, second and third gate conductive films, wherein the second gate conductive film is formed to become thinner than the first and third gate conductive films, and an intensity of plasma emission generated from the second gate conductive film is monitored during the etching to detect a change in the plasma emission intensity occurring when the second gate conductive film is etched away, to thereby detect an end-point of the etching for the first, second and third gate conductive films.

Preferably, in the method according the second aspect of the method, the first gate conductive film and the third gate conductive film are made of an identical material.

Preferably, in the method according to the second or third aspect of the present invention, the pillar-shaped semiconductor layer has a third protective film formed on a top thereof.

DETAILED DESCRIPTION OF THE PREFERRED EMBODIMENTS

An SGT production method capable of detecting an etching end-point by monitoring a plasma emission intensity during dry etching for a pillar-shaped silicon layer and a gate electrode will now be described

First Embodiment

A first embodiment of the present invention provides a method for, in an operation of forming a pillar-shaped silicon layer by dry etching, accurately controlling an etching amount of the pillar-shaped silicon layer, using an end-point detection process based on monitoring of a plasma emission intensity.

Figure 1:
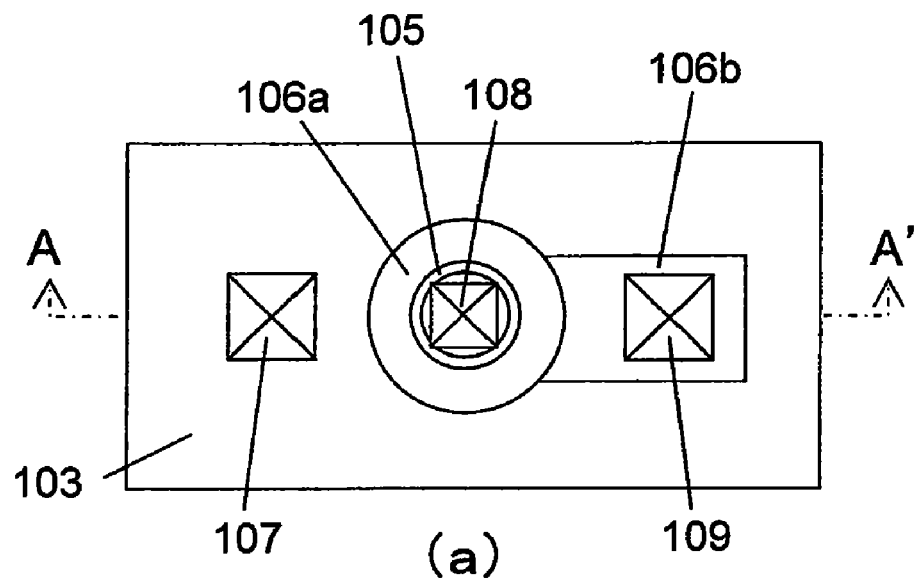
FIGS. 1(a) and 1(b) are, respectively, a top plan view and a sectional view of an SGT produced by a production method according to a first embodiment of the present invention.
Figure 1:
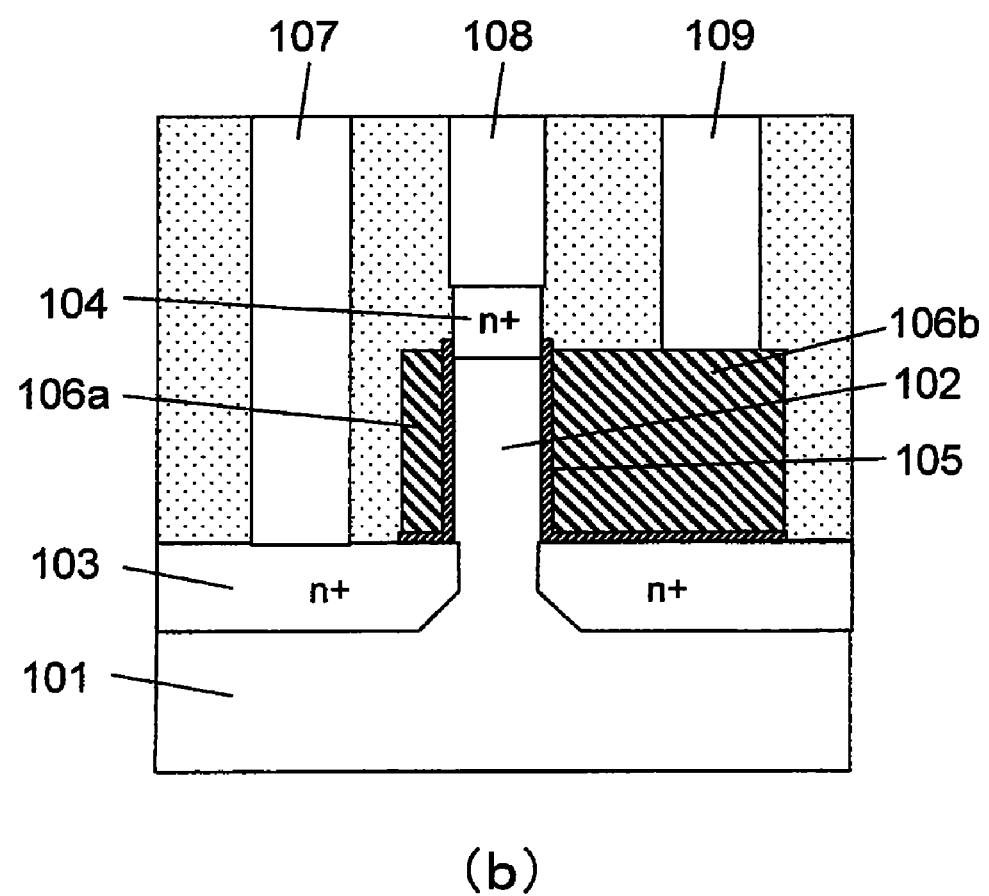
Figure 2:
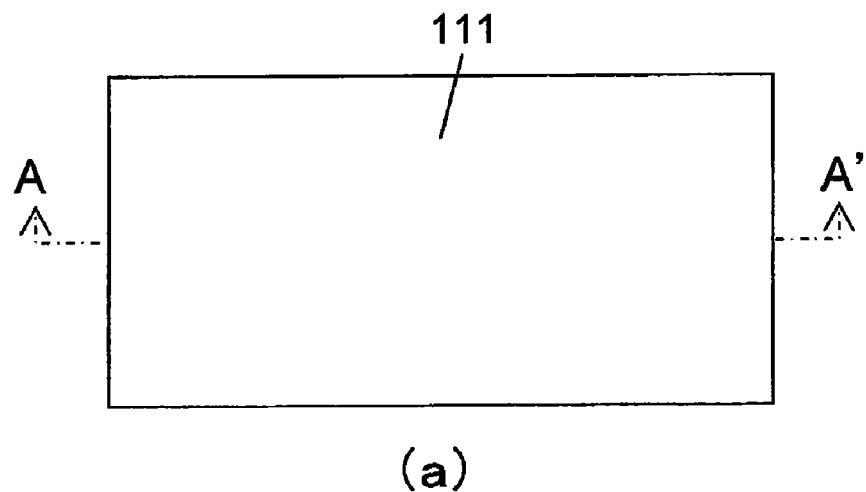
FIGS. 2(a) and 2(b) are process diagrams showing the production process according to the first embodiment, on a step-by-step basis.
Figure 2:
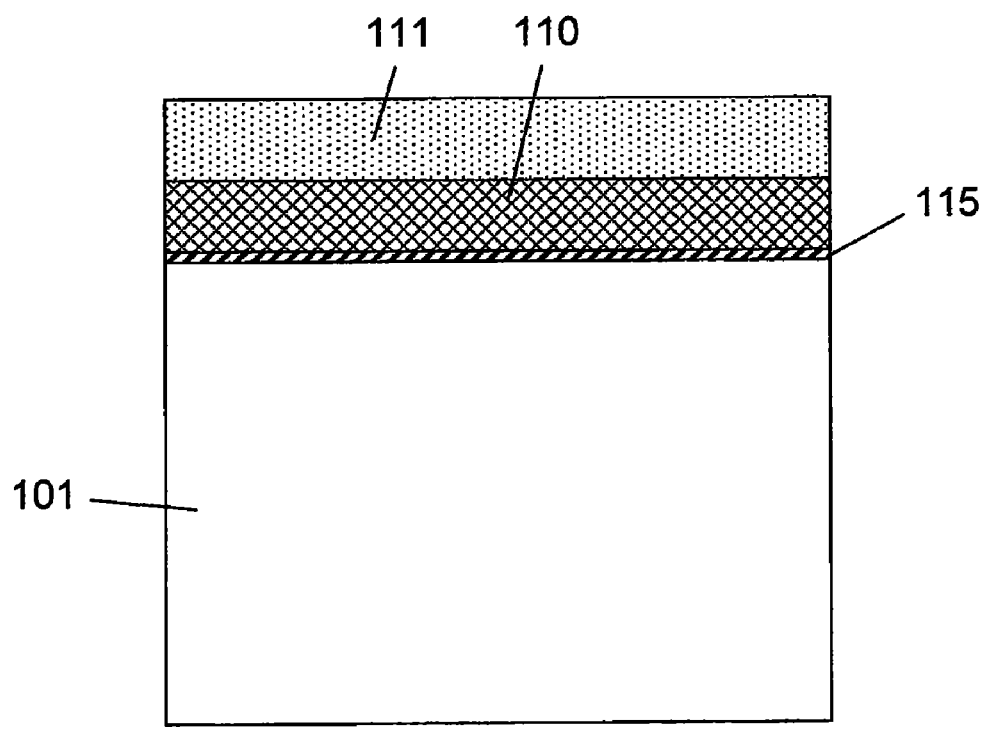
Figure 3:
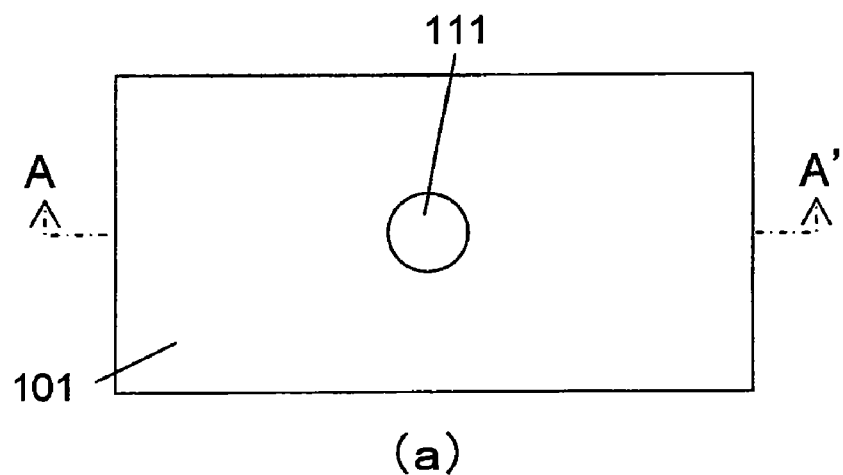
FIGS. 3(a) and 3(b) are process diagrams showing the production process according to the first embodiment, on a step-by-step basis.
Figure 3:
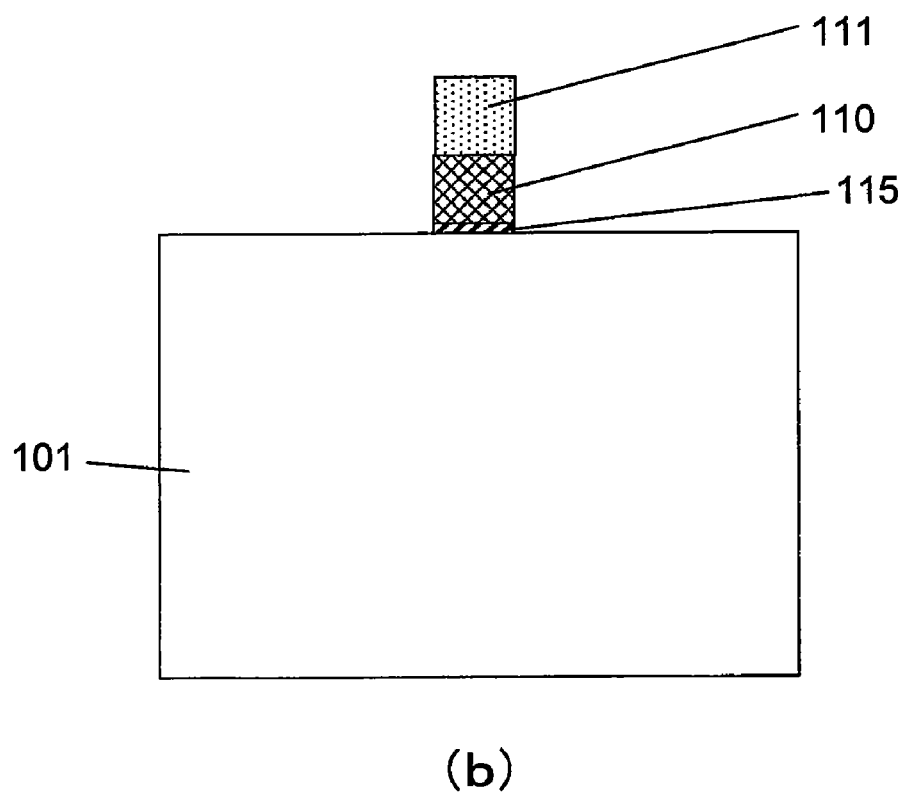
Figure 4:
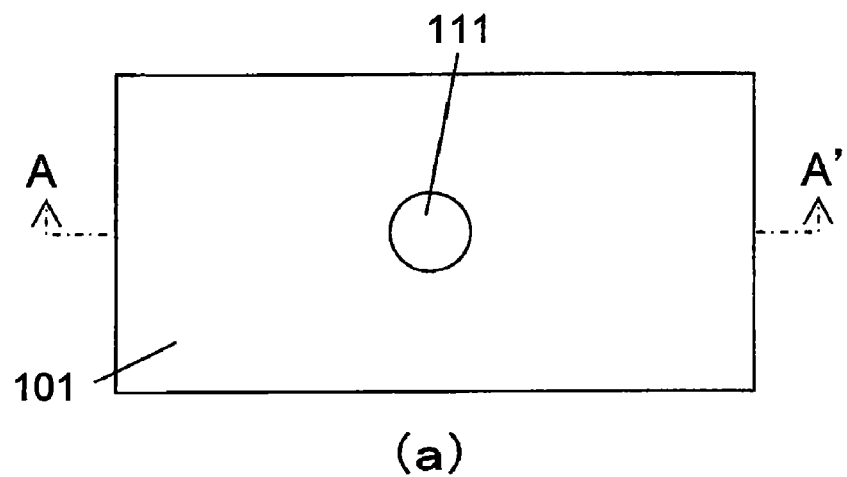
FIGS. 4(a) and 4(b) are process diagrams showing the production process according to the first embodiment, on a step-by-step basis.
Figure 4:
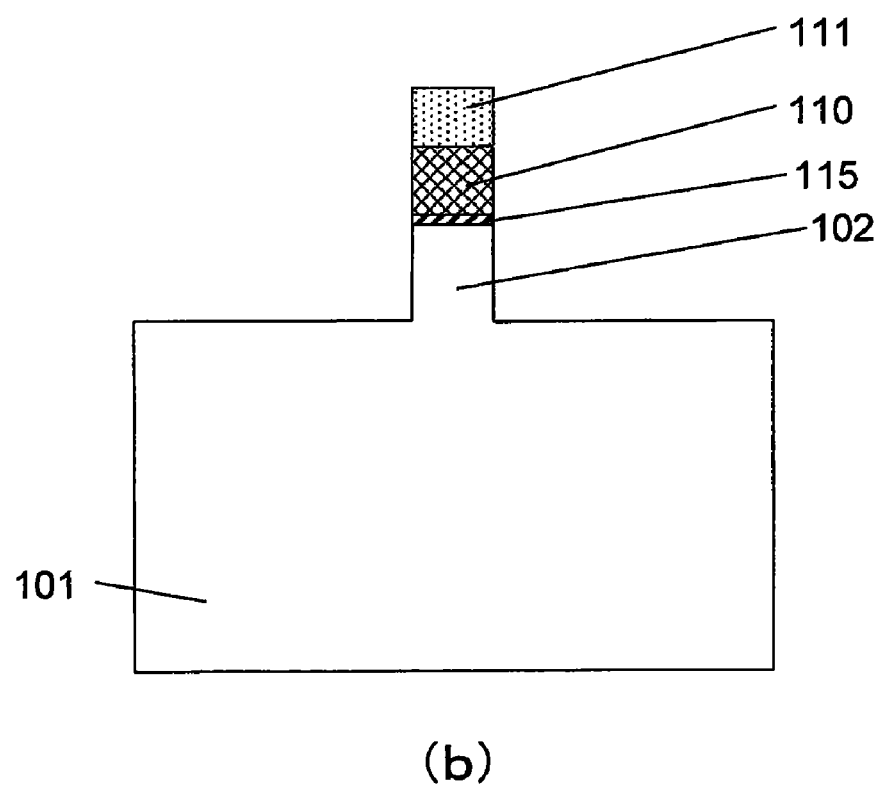
Figure 5:
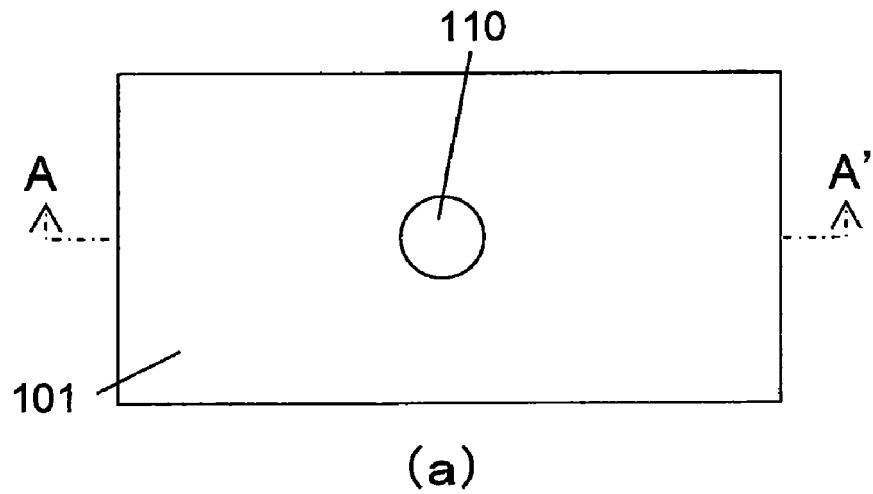
FIGS. 5(a) and 5(b) are process diagrams showing the production process according to the first embodiment, on a step-by-step basis.
Figure 5:
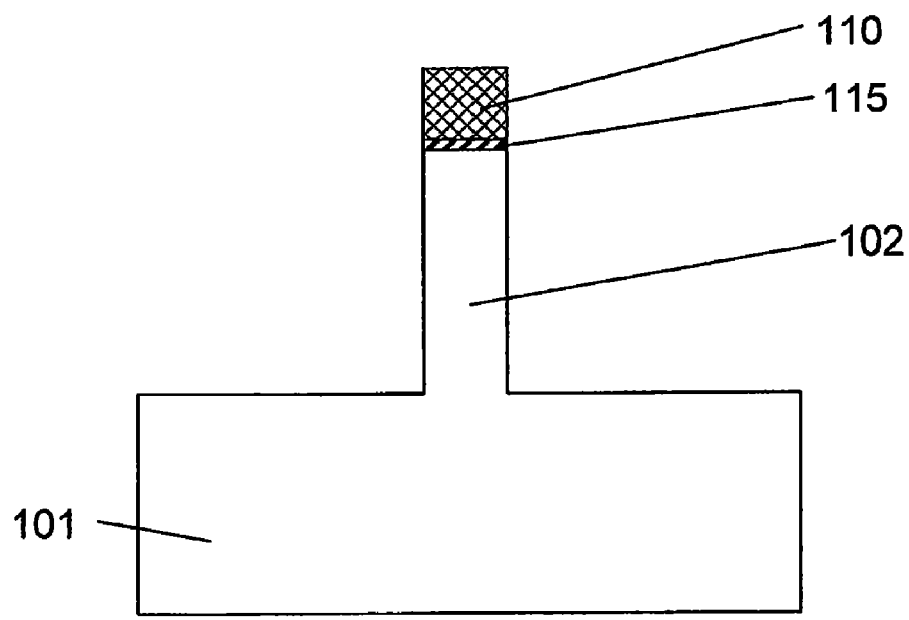

FIG. 1(a) is a top plan view showing an NMOS SGT produced by the method according to the first embodiment, and FIG. 1(b) is a sectional view taken along the line A-A' in FIG. 1(a). With reference to FIGS. 1(a) and 1(b), the SGT produced by the method according to the first embodiment will be described below.

A pillar-shaped silicon layer 102 is formed on a silicon substrate 101, and a gate dielectric film 105 and a gate electrode 106a are formed around the pillar-shaped silicon layer 102. An N⁺ drain diffusion layer 103 is formed underneath the pillar-shaped silicon layer 102, and an N⁺ source diffusion layer 104 is formed on a top of the pillar-shaped silicon layer 102. A contact 107, a contact 108, and a contact 109, are formed on the N⁺ drain diffusion layer 103, the N⁺ source diffusion layer 104, and a gate line 106b extending from the gate electrode 106a, respectively.

Under conditions that the N⁺ source diffusion layer 104 is connected to a GND potential, and the N⁺ drain diffusion layer 103 is connected to a power supply potential Vcc, a potential ranging from zero to Vcc is applied to the gate electrode 106a to allow the SGT to operate as a transistor. Actually, respective functions of the source diffusion layer and the drain diffusion layer are interchanged in some operating conditions.

FIGS. 2(a) to 5(b) show one example of the production method which allows accurate etching for a pillar-shaped silicon layer. In FIGS. 2(a) to 5(b), the figure suffixed with (a) is a top plan view, and the figure suffixed with (b) is a sectional view taken along the line A-A' in the figure suffixed with (a).

As shown in FIGS. 2(a) and 2(b), a pad oxide film 115 is formed on a silicon substrate 101 to reduce a stress between the silicon substrate and an after-mentioned hard mask. Subsequently, a silicon nitride film 110 serving as a first hard mask is formed, and then a silicon-germanium film 111 serving as a second hard mask is formed.

As shown in FIGS. 3(a) and 3(b), a resist is patterned by lithography using a mask for a pillar-shaped silicon layer, and then the pad oxide film 115, the first hard mask 110 and the second hard mask 111 are patterned by dry etching.

Figure 6:
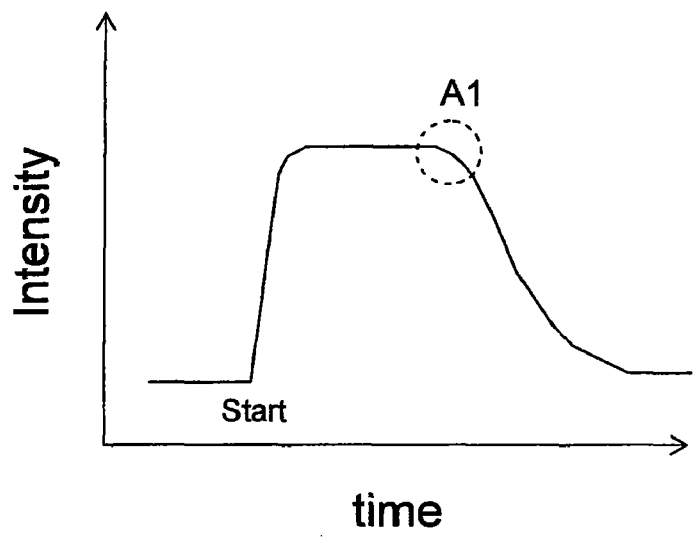
FIGS. 6(a) and 6(b) are graphs showing characteristic curves of a plasma emission intensity in the production process according to the first embodiment.
Figure 6:
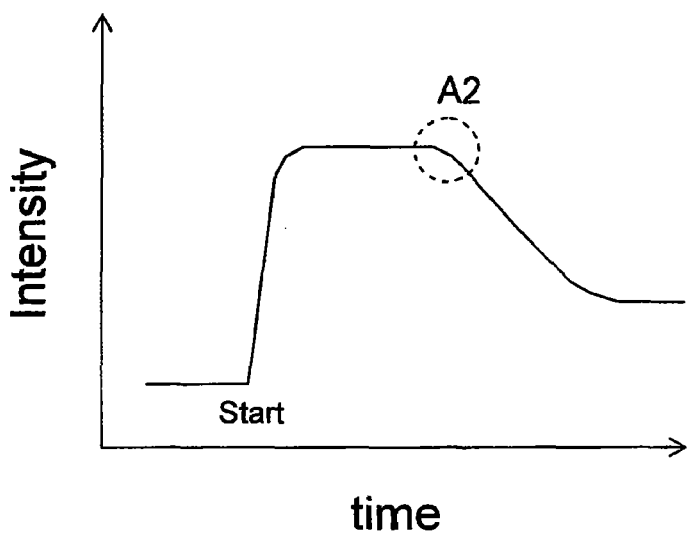
Figure 7:
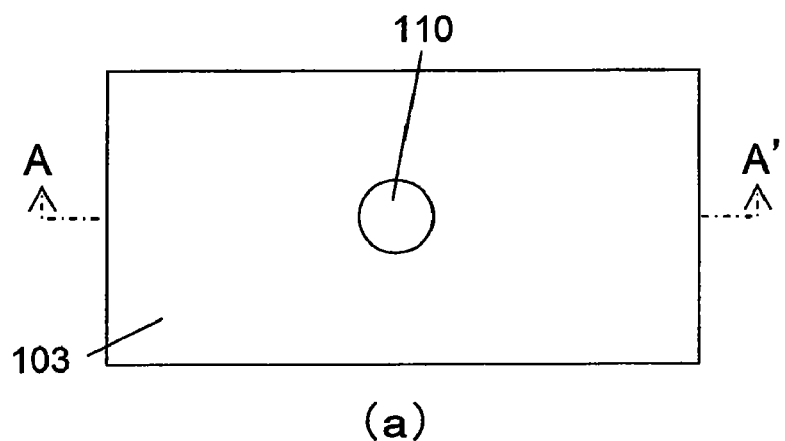
FIGS. 7(a) and 7(b) are process diagrams showing a production process according to a second embodiment of the present invention, on a step-by-step basis.
Figure 7:
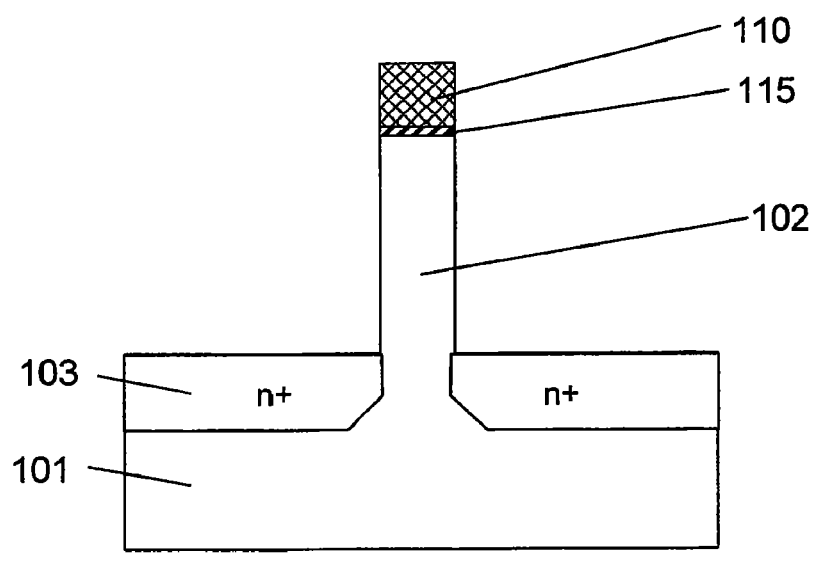
Figure 8:
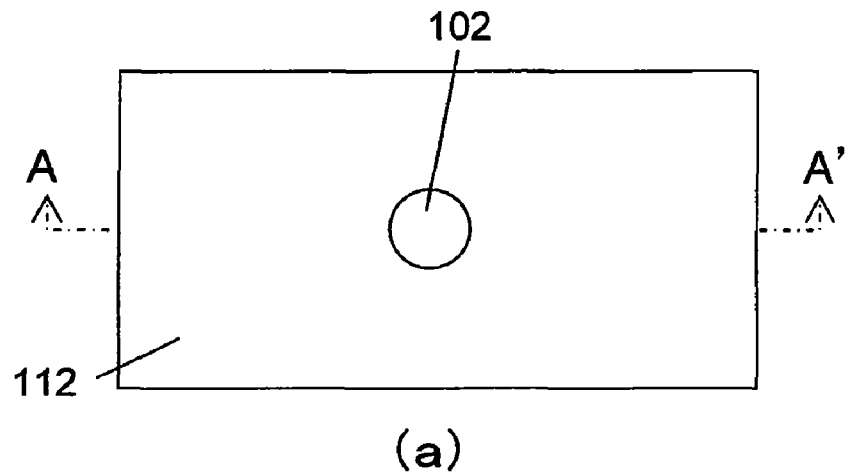
FIGS. 8(a) and 8(b) are process diagrams showing the production process according to the second embodiment, on a step-by-step basis.
Figure 8:
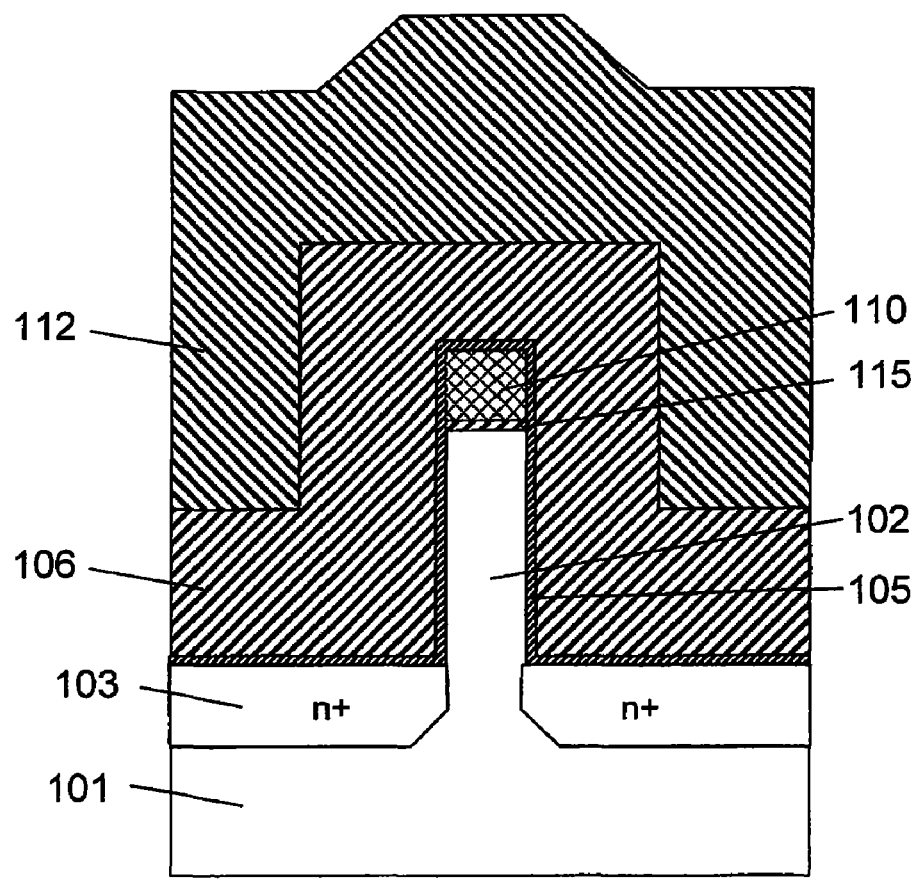
Figure 9:
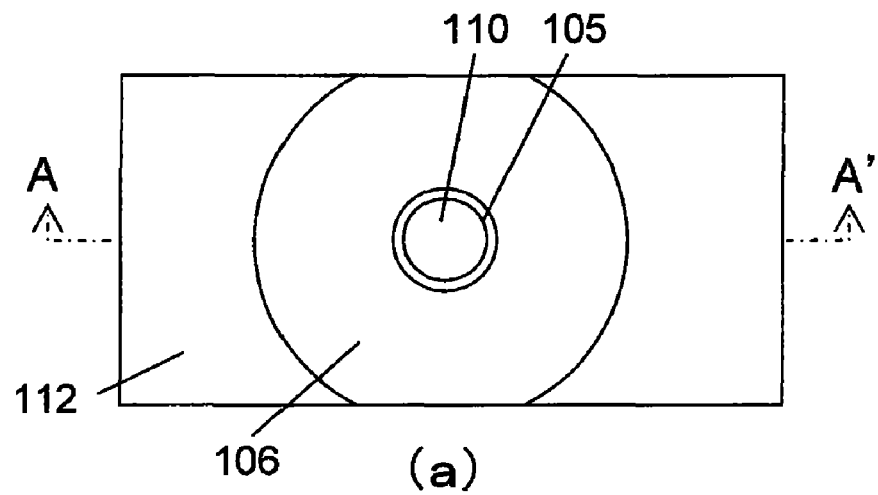
FIGS. 9(a) and 9(b) are process diagrams showing the production process according to the second embodiment, on a step-by-step basis.
Figure 9:
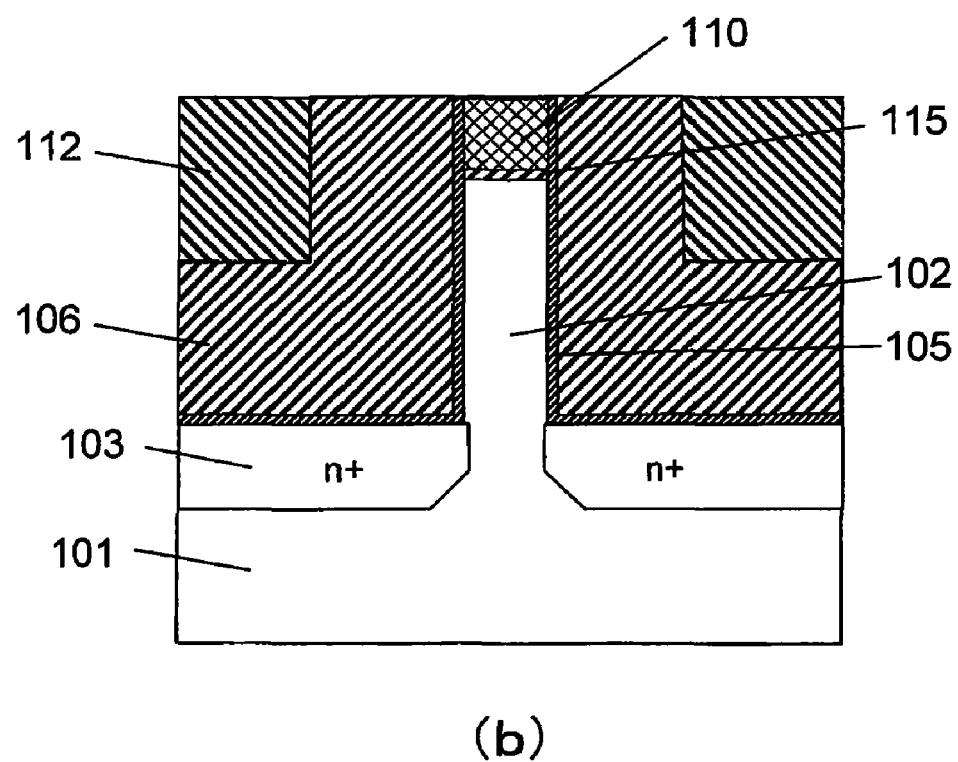
Figure 10:
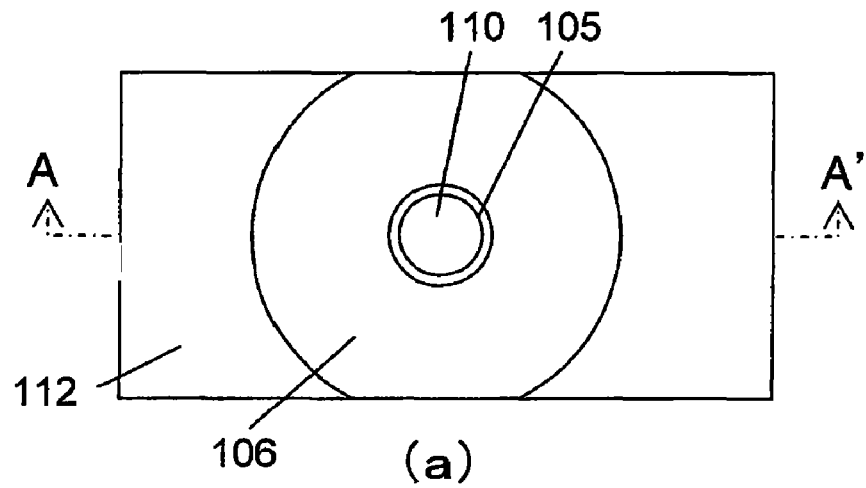
FIGS. 10(a) and 10(b) are process diagrams showing the production process according to the second embodiment, on a step-by-step basis.
Figure 10:
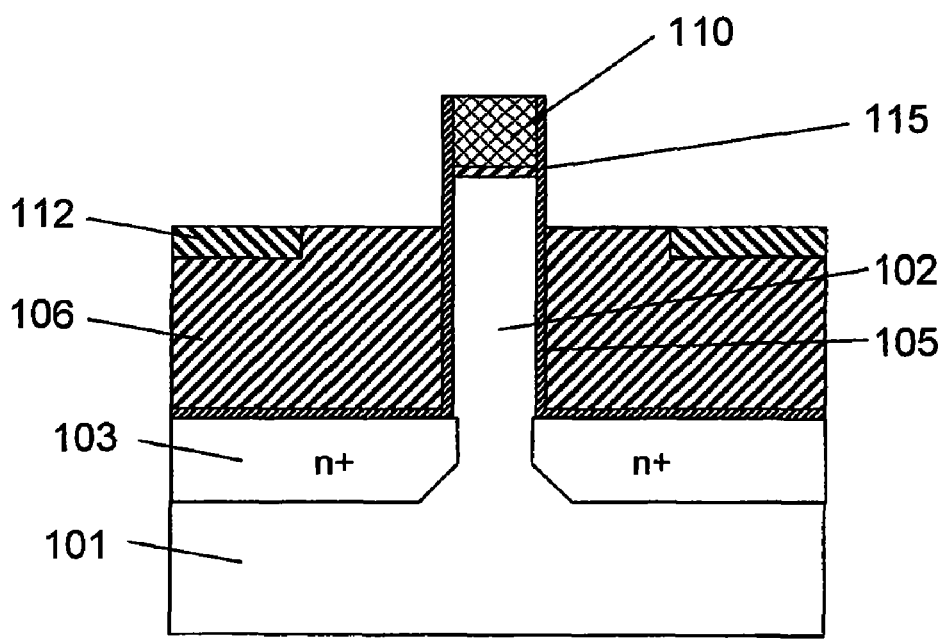
Figure 11:
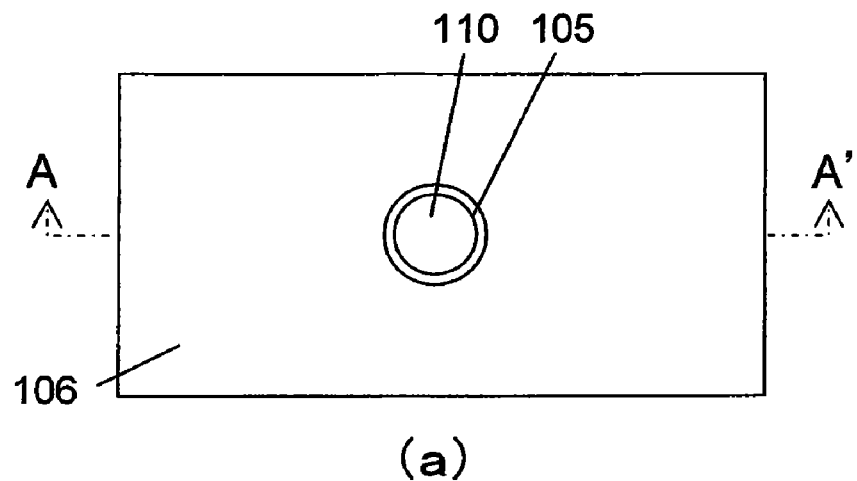
FIGS. 11(a) and 11(b) are process diagrams showing the production process according to the second embodiment, on a step-by-step basis.
Figure 11:
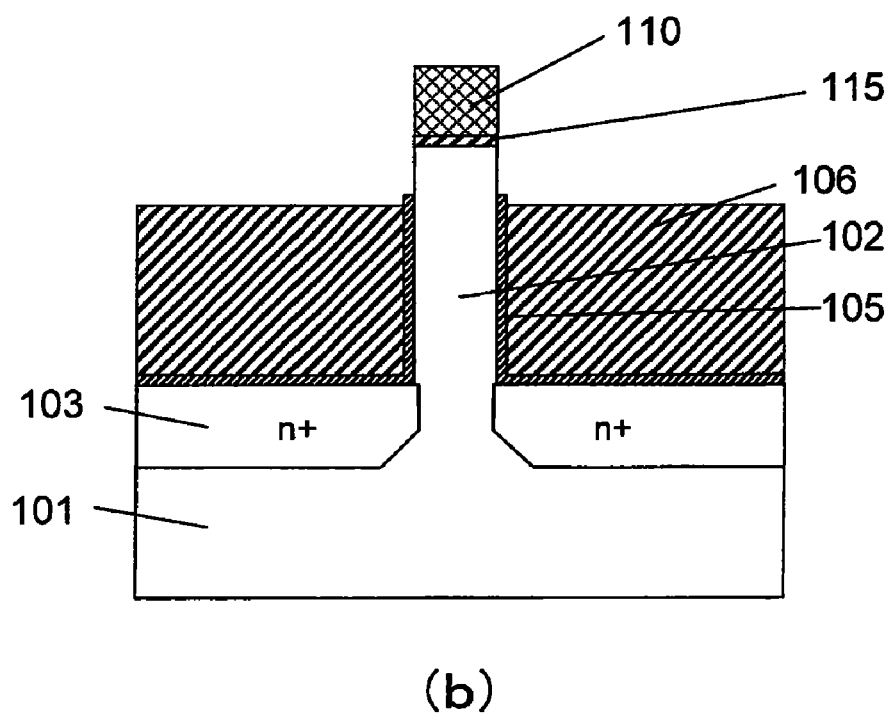
Figure 12:
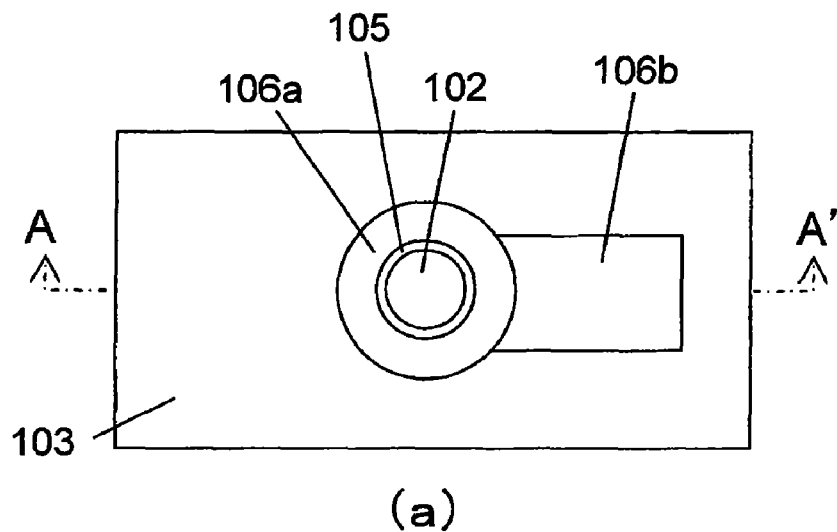
FIGS. 12(a) and 12(b) are process diagrams showing the production process according to the second embodiment, on a step-by-step basis.
Figure 12:
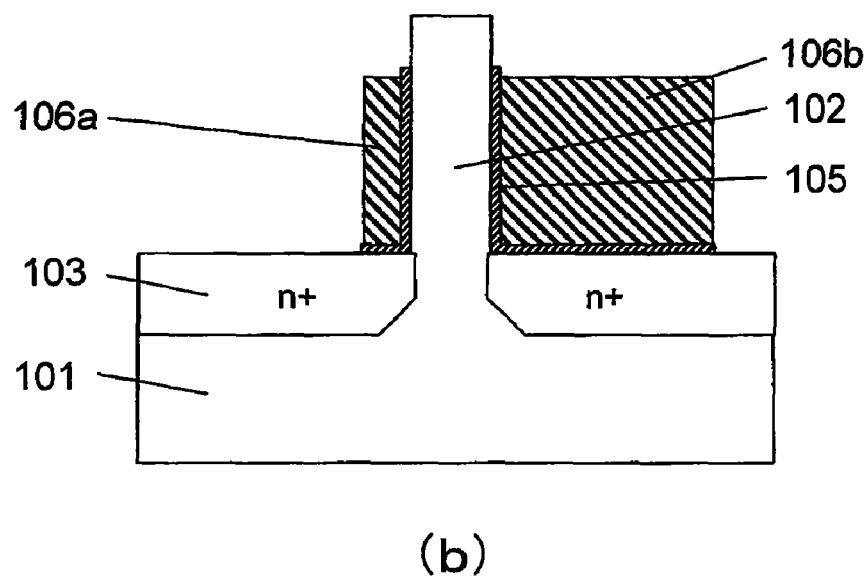
Figure 13:
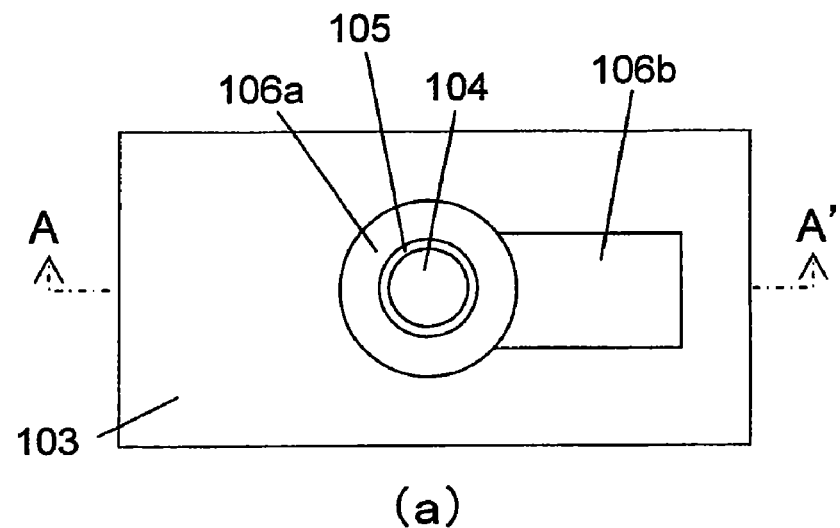
FIGS. 13(a) and 13(b) are process diagrams showing the production process according to the second embodiment, on a step-by-step basis.
Figure 13:
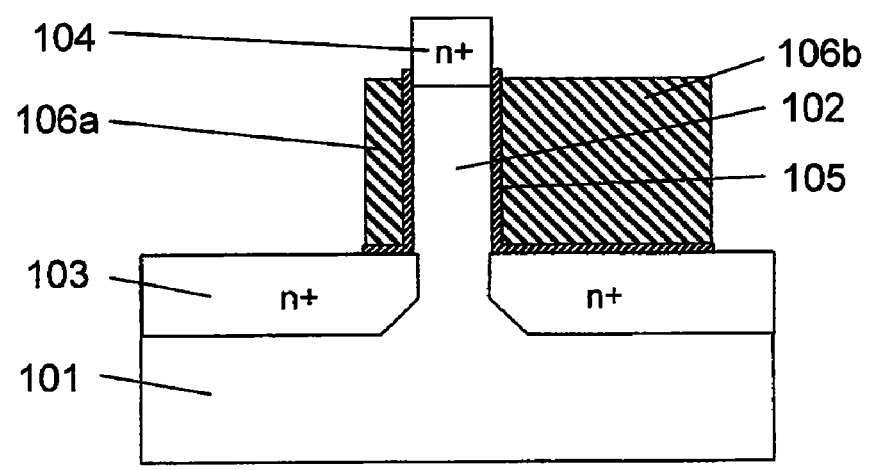
Figure 14:
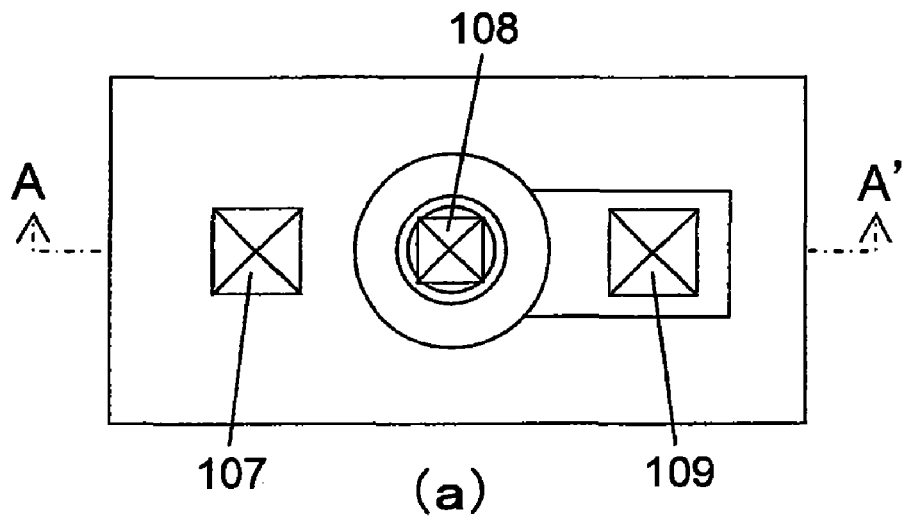
FIGS. 14(a) and 14(b) are process diagrams showing the production process according to the second embodiment, on a step-by-step basis.
Figure 14:
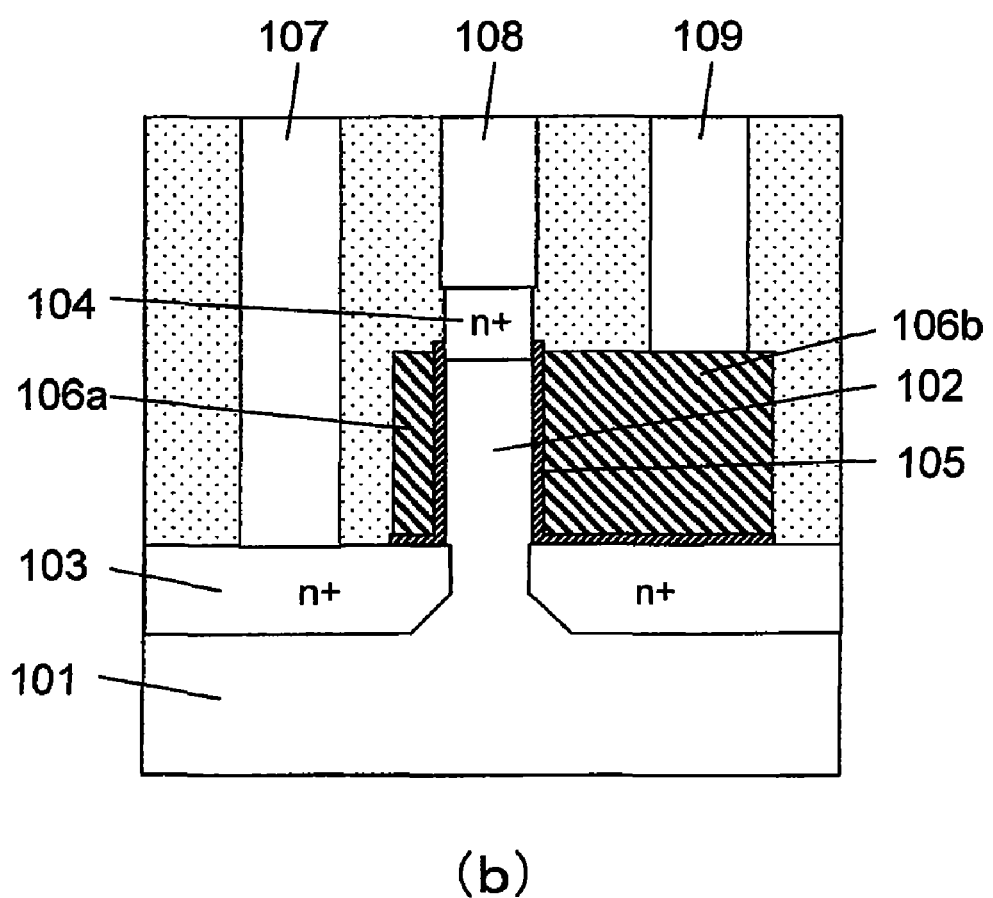

As shown in FIGS. 4(a) and 4(b), a pillar-shaped silicon layer 102 is formed by dry etching using the first and second hard masks 110, 111 as a mask. FIGS. 4(a) and 4(b) show a structure during the etching. During the etching, the pillar-shaped silicon layer is gradually formed along with progress of etching against the silicon substrate, and simultaneously the second hard mask 111, i.e., a silicon-germanium film, is gradually etched at approximately the same etching rate as that of the silicon substrate. When the etching is further progressed, and a remaining small part of the second hard mask starts to be further etched, a plasma emission intensity of germanium will decrease. Thus, an etching end-point can be detected. FIG. 6(a) is a graph schematically showing a characteristic curve of the plasma emission intensity of germanium. When the etching is started at the time indicated by "Start" in FIG. 6(a), the plasma emission intensity of germanium sharply increases. Then, when only a small part of the silicon-germanium film as the second hard mask is left due to the progress of etching at the time A1 in FIG. 6(a), the plasma emission intensity of germanium starts decreasing. The etching end-point can be detected by monitoring the decrease in the plasma emission intensity of germanium. Even if an etching rate for forming the pillar-shaped silicon layer is different from that of the second hard mask, there is no problem as long as the end-point can be detected based on the second hard mask before the pillar-shaped silicon layer is formed by etching to have a desired height dimension.

In case where the second hard mask is made of polysilicon, instead of germanium, it is also possible to detect the etching end-point. In this case, the etching end-point can be detected by monitoring a plasma emission intensity of silicon. FIG. 6(b) is a graph schematically showing a characteristic curve of the plasma emission intensity of silicon. When etching is started at the time indicated by "Start" in FIG. 6(b), the plasma emission intensity of silicon sharply increases. Then, when only a small part of the polysilicon film as the second hard mask is left due to the progress of etching at the time A2 in FIG. 6(b), an amount of silicon to be etched declines by the decrease in the second hard mask, and thereby the plasma emission intensity of silicon also decreases by just that much. The etching end-point can be detected by monitoring the decrease in the plasma emission intensity of silicon.

As shown in FIGS. 5(a) and 5(b), after completion of the dry etching, the second hard mask is completely etched away, and the pillar-shaped silicon layer 102 is formed. Further, an upper portion of the pillar-shaped silicon layer 102 is protected from the etching, by the first hard mask 110. In order to obtain a pillar-shaped silicon layer having a desired height dimension, the etching may be continued for a specific time which is calculated in consideration of an etching rate for an etching operation after the detection of the etching end-point.

In the first embodiment, silicon-germanium and polysilicon are shown as a material of the second hard mask. Alternatively, the second hard mask may be made of any other suitable material allowing an etching end-point to be detected in the above manner, such as amorphous silicon. Further, a silicon nitride film is shown as the first hard mask. Alternatively, the first hard mask may be any other suitable film capable of protecting an upper portion of the pillar-shaped silicon layer from the etching.

Second Embodiment

A second embodiment of the present invention provides a method for, in an operation of forming a gate electrode by dry etching, accurately controlling an etching amount of the gate electrode, using an end-point detection process based on monitoring of a plasma emission intensity. An SGT to be produced by the method according to the second embodiment has the same structure as that illustrated in FIGS. 1(a) and 1(b).

FIGS. 7(a) to 14(b) show one example of the SGT production method based on accurate etching for a gate electrode. In FIGS. 7(a) to 14(b), the figure suffixed with (a) is a top plan view, and the figure suffixed with (b) is a sectional view taken along the line A-A' in the figure suffixed with (a).

FIGS. 7(a) and 7(b) show a configuration before forming a gate conductive film. An $N^+$ diffusion layer 103 is formed in a diffusion region beneath a pillar-shaped silicon layer, by impurity implantation or the like.

As shown in FIGS. 8(a) and 8(b), a gate dielectric film 105 is formed. Then, a first gate conductive film 106 is made, for example, of polysilicon, and formed to cover the gate dielectric film 105 and have a film thickness greater than a desired gate length. Then, a second gate conductive film 112 is made, for example, of silicon-germanium, and formed to cover the first gate conductive film 106. In this manner, the gate dielectric film 105, the first gate conductive film 106 and the second gate conductive film 112 are formed in this order to allow the pillar-shaped silicon layer 102 to be buried therein.

As shown in FIGS. 9(a) and 9(b), respective portions of the first and second gate conductive films 106, 112 and the gate dielectric film 105 above the pillar-shaped silicon layer 102 are polished by CMP, to flatten respective top surfaces of the first and second gate conductive films. The flattening of a top of the first and second gate conductive films by CMP facilitates control of the gate length. During the CMP, a first hard mask 110 on the top of the pillar-shaped silicon layer is used as a CMP stopper. A silicon nitride film may be used as the first hard mask. In this case, a selectivity ratio between the first hard mask and each of the first and second gate conductive films can be set to a large value to control a CMP amount with high repeatability.

As shown in FIGS. 10(a) and 10(b), the first and second gate conductive films 106, 112 are etched back to set the gate length. FIGS. 10(a) and 10(b) show a structure during the etching. Preferably, during the etching, the first gate conductive film 106, i.e., a polysilicon film, and the second gate conductive film 112, i.e., a silicon-germanium film, are etched at the same etching rate. When the etching is progressed up to a position close to a boundary between the first and second gate conductive films 106, 112 in a vertical direction, and only a small part of the silicon-germanium film as the second gate conductive film 112 is left, a plasma emission intensity of germanium starts decreasing, so that an etching end-point can be detected. In this case, the same plasma emission characteristic as that in FIG. 6(a) is exhibited. As above, an etching end-point detection process in the second embodiment is intended to detect the vertical boundary between the first and second gate conductive films 106, 112 in the vertical direction. An upper portion of the pillar-shaped silicon layer 102 is protected from the etching, by the first hard mask 110.

In case where a stepped portion is formed between the diffusion layer underneath the pillar-shaped silicon layer and an element isolation region, there can be a plurality of boundaries between the first and second gate conductive films 106, 112 in the vertical direction. In this case, a setting of an algorithm for the end-point detection may be adjusted to detect an etching end-point based on one of the boundaries which is first exposed, or may be adjusted to detect the etching end-point based on one of the remaining boundaries which is subsequently exposed.

In case where each of the first and second gate conductive films is made of a metal, the first gate conductive film and the second gate conductive film may be made, respectively, of tantalum nitride and titanium nitride, to detect an etching end-point in the same manner. Further, in place of the second gate conductive film, a dielectric film, such as a silicon oxide film, may be used. As substitute for the above materials, any other suitable conductive material may be selected, as long as each of the first and second conductive films exhibits a different plasma emission characteristic to allow an etching end-point to be detected in the above manner.

As shown in FIGS. 11(a) and 11(b), after completion of the dry etching, the second gate conductive film 112 in a gate electrode region around the pillar-shaped silicon layer is completely etched away, and a gate electrode is formed by the first gate conductive film 106. Therefore, the first gate conductive film 106 should be initially formed to have a thickness greater than the final gate length.

As shown in FIGS. 12(a) and 12(b), the pad oxide film 115 and the first hard mask is removed by dry etching or wet etching. Then, the first gate conductive film is patterned to form a gate electrode surrounding the pillar-shaped silicon layer, and a gate line on which a contact or the like is to be formed.

As shown in FIGS. 13(a) and 13(b), a diffusion layer 104 is formed in an upper portion of the pillar-shaped silicon layer, by impurity implantation or the like.

As shown in FIGS. 14(a) and 14(b), an interlayer film is formed, and a contact (107, 108, 109) is formed. In the above manner, a transistor is formed.

Third Embodiment

A third embodiment of the present invention provides another method for, in an operation of forming a gate electrode by dry etching, accurately controlling an etching amount of the gate electrode, using an end-point detection process based on monitoring of a plasma emission intensity. An SGT to be produced by the method according to the third embodiment has the same structure as that illustrated in FIGS. 1(a) and 1(b).

FIGS. 7(a) to 14(b) show one example of the SGT production method based on accurate etching for a gate electrode. In FIGS. 7(a) to 14(b), the figure suffixed with (a) is a top plan view, and the figure suffixed with (b) is a sectional view taken along the line A A' in the figure suffixed with (a).

Figure 15:
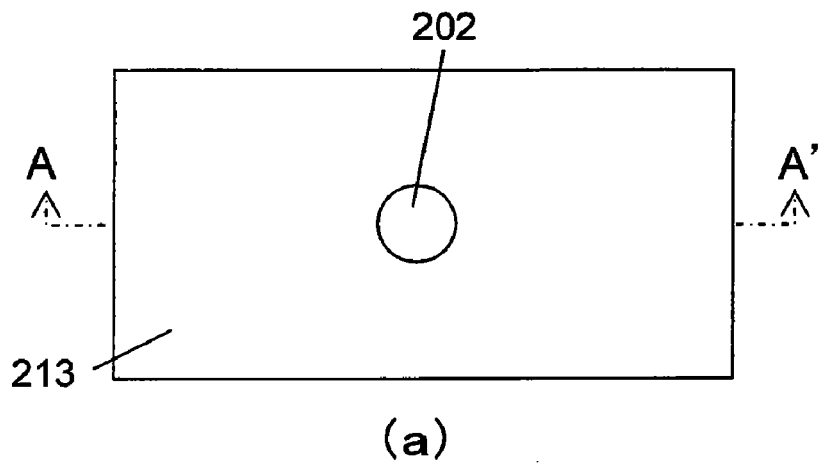
FIGS. 15(a) and 15(b) are process diagrams showing a production process according to a third embodiment of the present invention, on a step-by-step basis.
Figure 15:
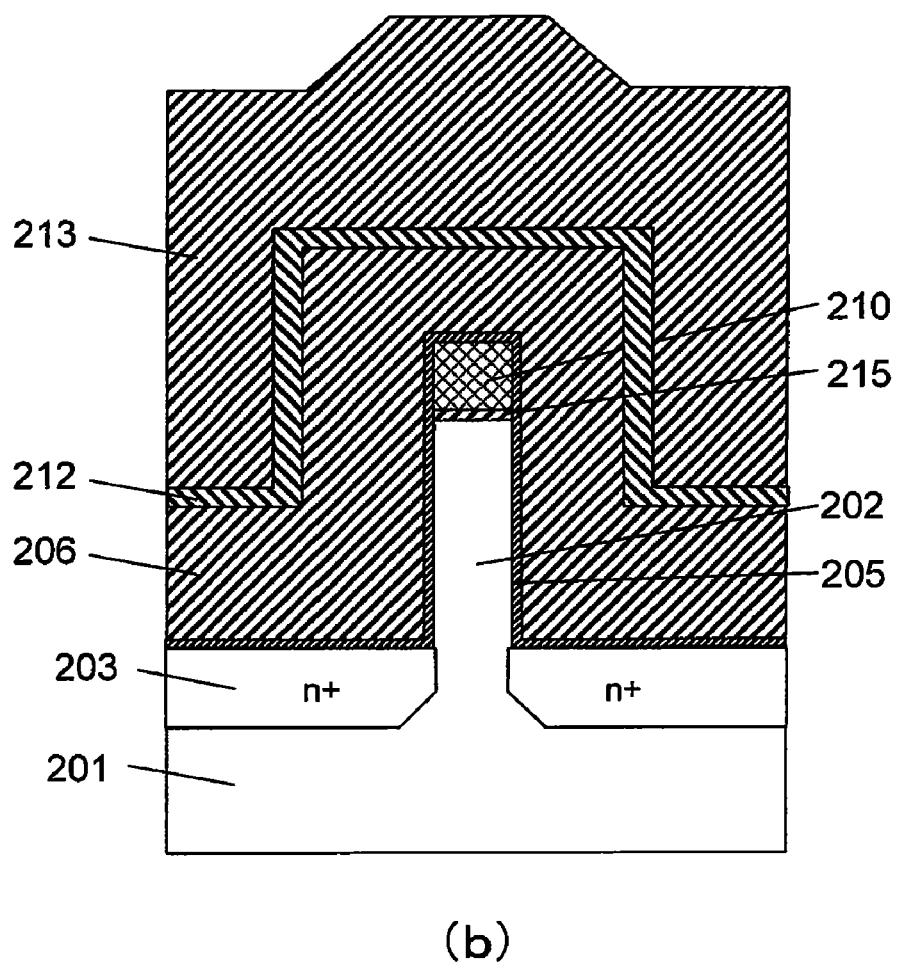

FIGS. 15(a) and 15(b) show a sectional structure after forming a gate conductive film. In the third embodiment, the gate conductive film comprises a first gate conductive film, a second gate conductive film and a third gate conductive film. The first gate conductive film 206 is made, for example, of polysilicon, and formed to have a film thickness greater than a desired gate length. The second gate conductive film 212 is made, for example, of silicon-germanium, and formed to cover the first gate conductive film 206. The third gate conductive film 213 is made, for example, of polysilicon, and formed to cover the second gate conductive film 212 and have a film thickness greater than that of the second gate conductive film 212. In this manner, the first gate conductive film 206, the second gate conductive film 212 and the third gate conductive film 213 are formed in this order to allow a pillar-shaped silicon layer 202 to be buried therein.

Figure 16:
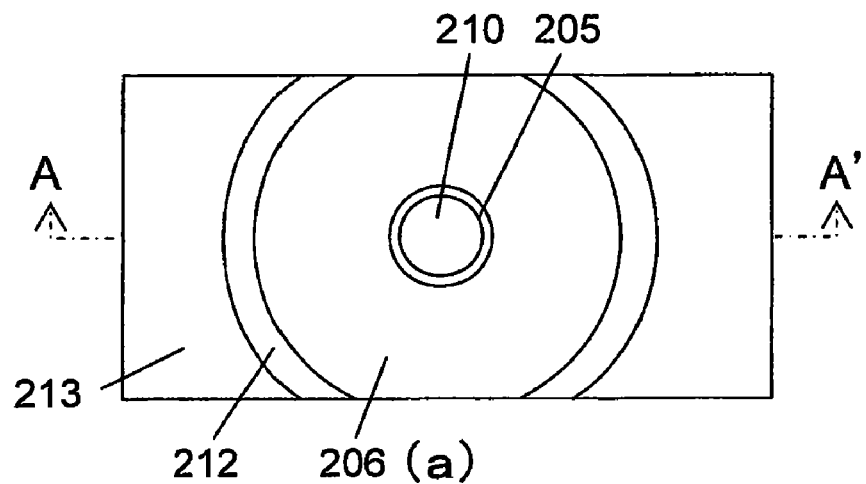
FIGS. 16(a) and 16(b) are process diagrams showing the production process according to the third embodiment, on a step-by-step basis.
Figure 16:
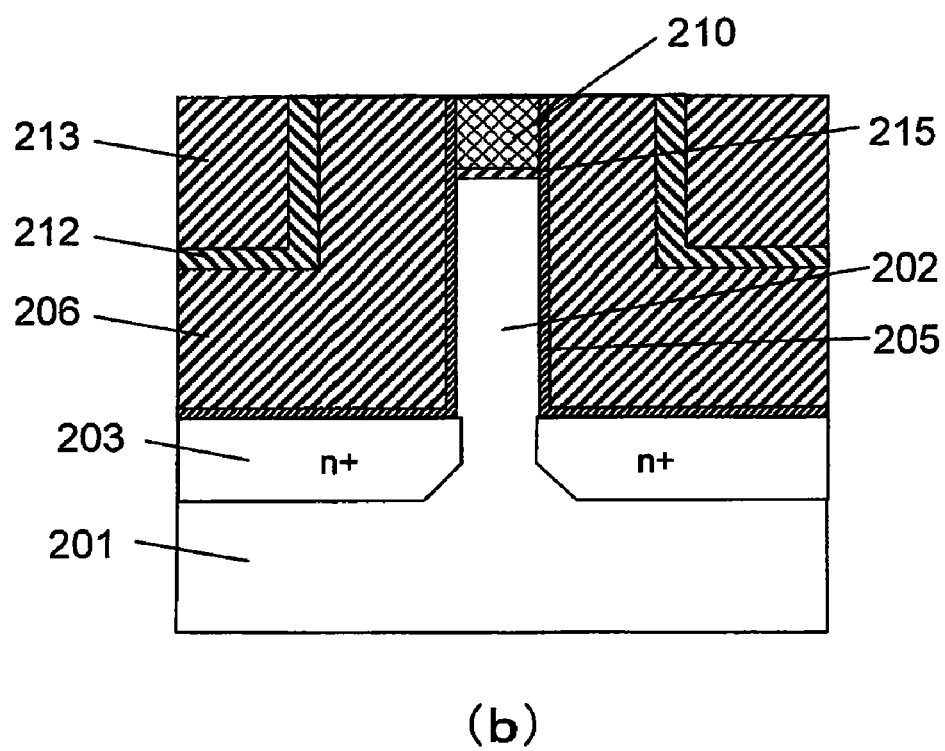

As shown in FIGS. 16(a) and 16(b), respective portions of the first to third gate conductive films and a gate dielectric film 205 above the pillar-shaped silicon layer are polished by CMP, to flatten respective top surfaces of the first to third gate conductive films. The flattening of a top of the first to third gate conductive films by CMP facilitates control of the gate length. During the CMP, a first hard mask 210 on a top of the pillar-shaped silicon layer is used as a CMP stopper. A silicon nitride film may be used as the first hard mask 210. In this case, a selectivity ratio between the first hard mask and each of the first to third gate conductive films can be set to a large value to control a CMP amount with high repeatability.

Figure 17:
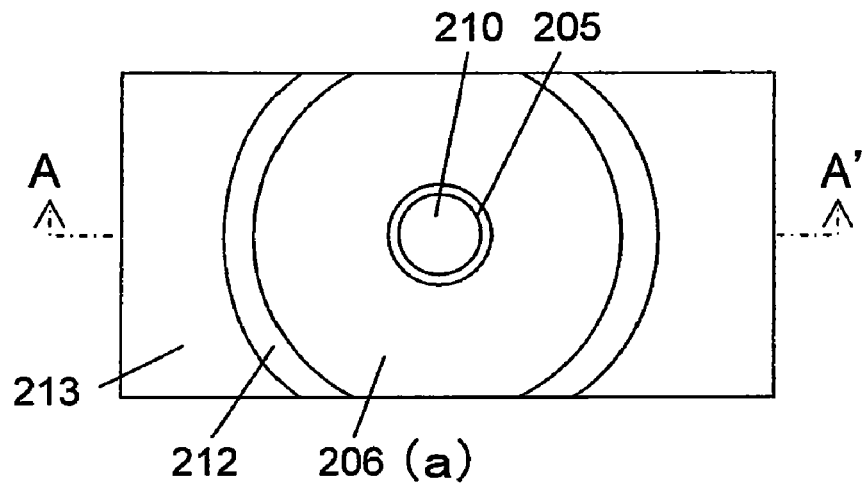
FIGS. 17(a) and 17(b) are process diagrams showing the production process according to the third embodiment, on a step-by-step basis.
Figure 17:
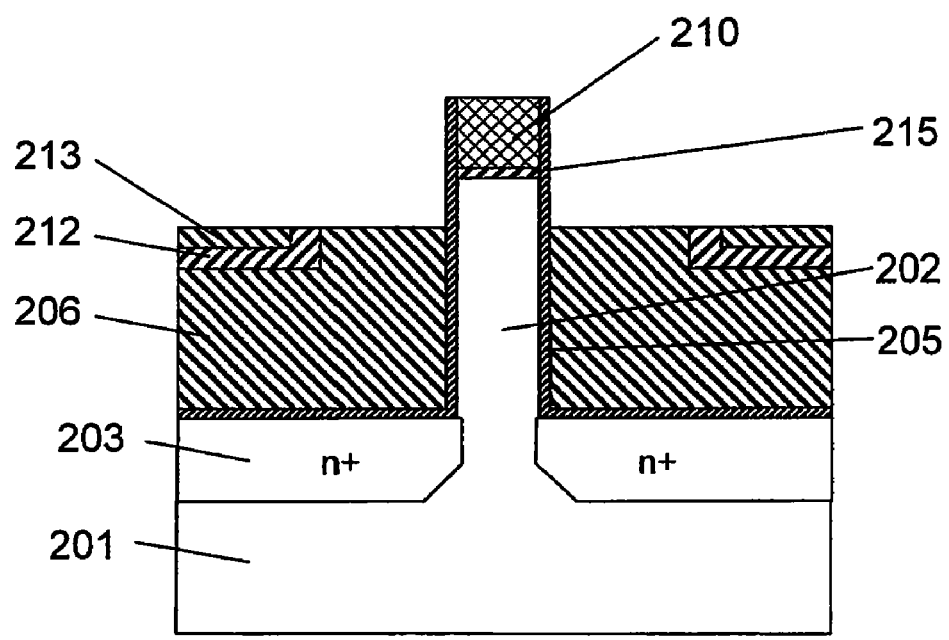

As shown in FIGS. 17(*a*) and 17(*b*), the first to third gate conductive films are etched back to set the gate length. FIGS. 17(*a*) and 17(*b*) show a structure during the etching. Preferably, during the etching, the first gate conductive film 206, i.e., a polysilicon film, the second gate conductive film 212, i.e., a silicon-germanium film, and the third gate conductive film 213, i.e., a polysilicon film, are etched at the same etching rate.

Figure 19:
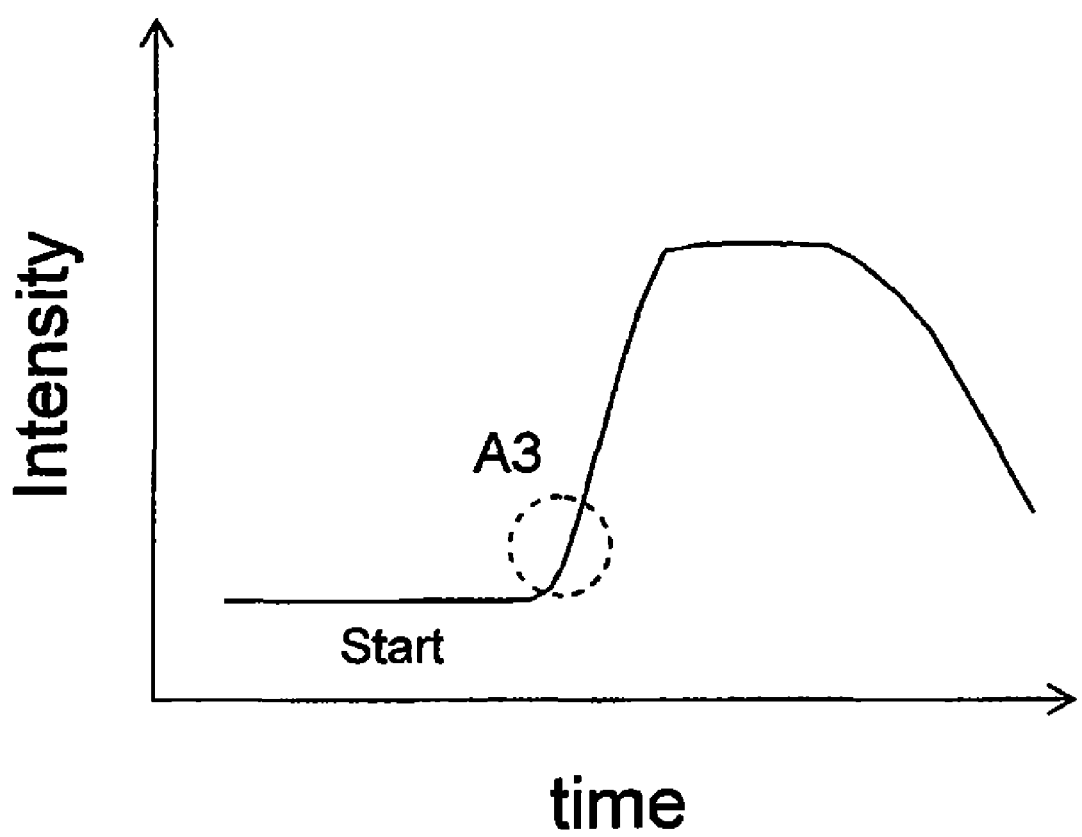
FIG. 19 is a graph showing a characteristic curve of a plasma emission intensity in the production process according to the third embodiment.
Figure 20:
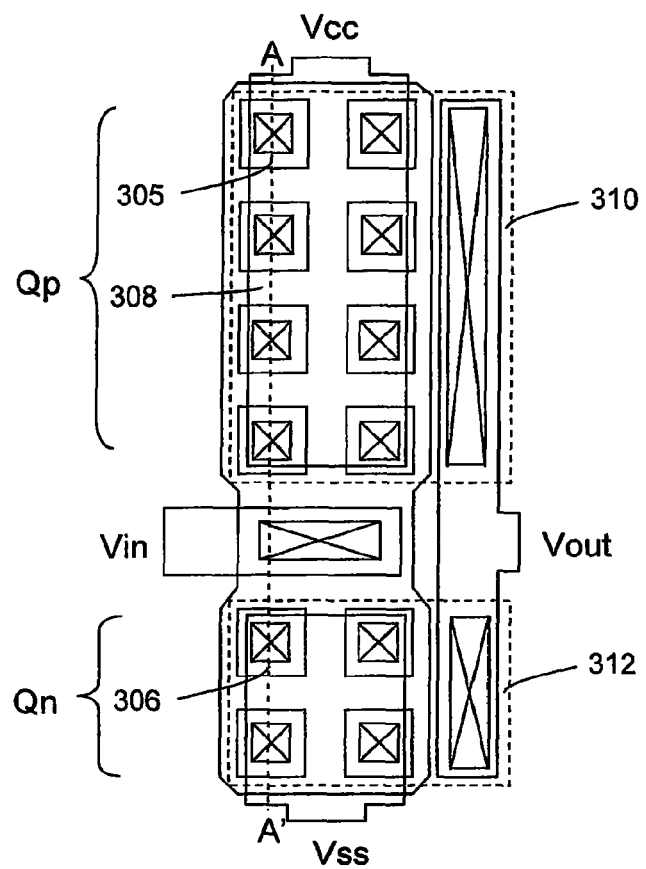
FIGS. 20(a) to 20(b) are, respectively, a top plan view and a sectional view of a conventional SGT.
Figure 20:
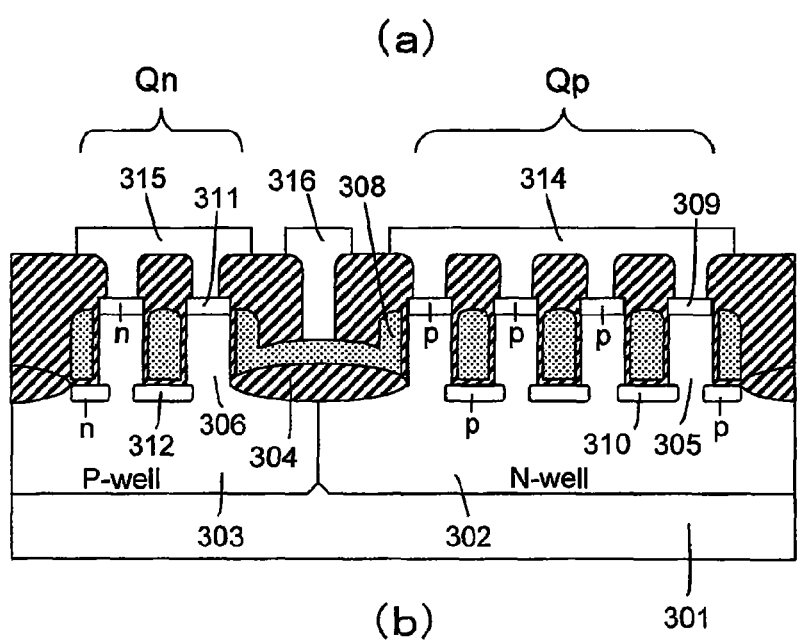
Figure 21:
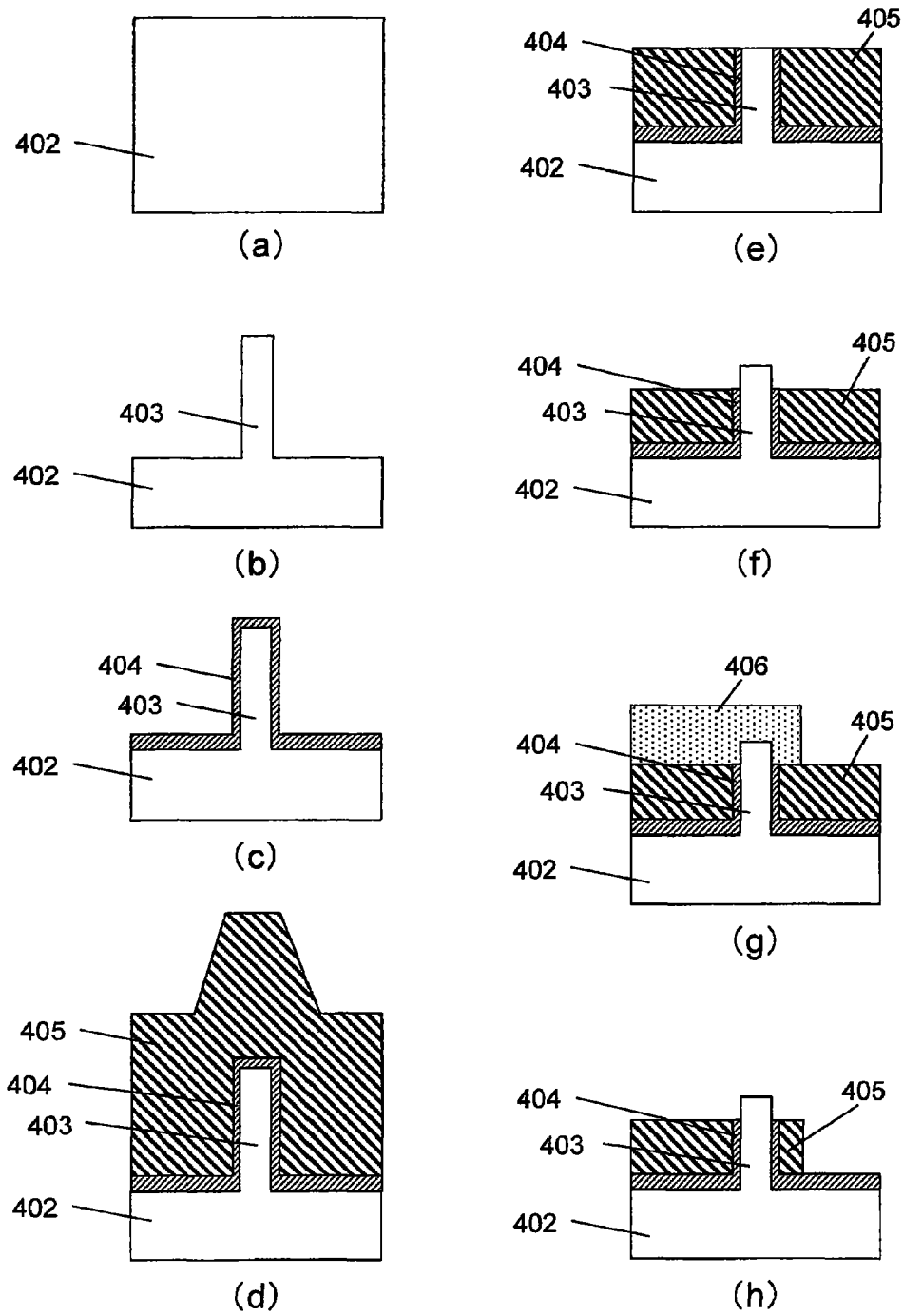
FIGS. 21(a) to 21(h) are diagrams showing a conventional SGT production method.

When the etching is progressed, and at least a part of a surface of the second gate conductive film 212, i.e., the silicon-germanium film, is exposed, a plasma emission intensity of germanium starts increasing, so that an etching end-point can be detected. FIG. 19 is a graph schematically showing a characteristic curve of the plasma emission intensity of germanium. Just after the etching is started at the time indicated by "Start" in FIG. 19, the intensity of plasma emission from the second gate conductive film 212, i.e., the silicon-germanium film, is significantly weak. Then, when the surface of the silicon-germanium film starts to be exposed, the plasma emission intensity of germanium sharply increases. Then, when the silicon-germanium film is further etched, and only a small part of the silicon-germanium film is left, the plasma emission intensity of germanium decreases again. The etching end-point can be detected by monitoring the increase in plasma emission intensity at the time indicated by A3 in FIG. 19.

In case where a stepped portion is formed between a diffusion layer underneath the pillar-shaped silicon layer and an element isolation region, there can be a plurality of boundaries between the first and second gate conductive films 206, 212 in a vertical direction. In this case, a setting of an algorithm for the end-point detection may be adjusted to detect an etching end-point based on one of the boundaries which is first exposed, or may be adjusted to detect the etching end-point based on one of the remaining boundaries which is subsequently exposed.

Figure 18:
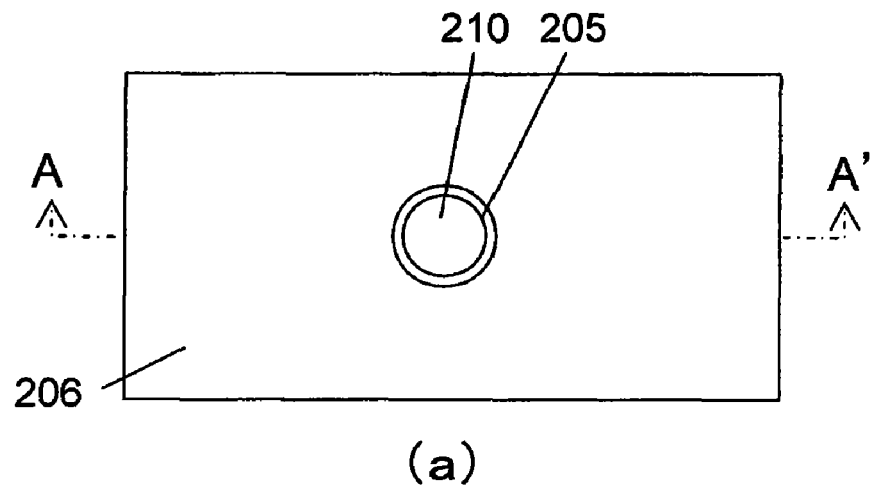
FIGS. 18(a) and 18(b) are process diagrams showing the production process according to the third embodiment, on a step-by-step basis.
Figure 18:
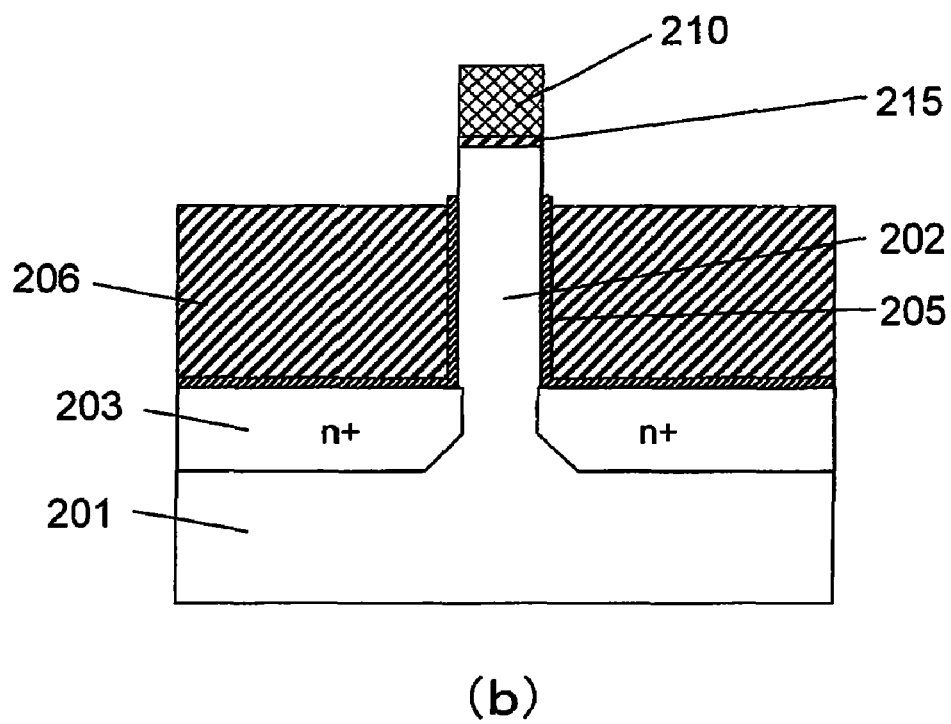

As shown in FIGS. 18(*a*) and 18(*b*), after completion of the dry etching, the second and third gate conductive films in a gate electrode region around the pillar-shaped silicon layer are completely etched away, and a gate electrode is formed by the first gate conductive film. Therefore, the first gate conductive film 206 should be initially formed to have a thickness greater than the final gate length.

In the third embodiment, a silicon-germanium film is used as the second gate conductive film. In place of the second gate conductive film, a dielectric film, such as a silicon oxide film, may be used. Further, in case where each of the first to third gate conductive films is made of a metal, the first gate conductive film, the second gate conductive film and the third gate conductive film may be made, respectively, of tantalum nitride, titanium nitride and tantalum nitride to detect an etching end-point in the same manner. As substitute for the above materials, any other suitable conductive material may be selected, as long as an etching end-point can be detected based on a plasma emission characteristic in the above manner.

As described above, in the production method of the present invention, during dry etching for forming a pillar-shaped silicon layer and a gate electrode of an SGT, an etching amount can be controlled using an end-point detection process, so that the SGT can be produced while stabilizing a height dimension of the pillar-shaped semiconductor layer, and a gate length. This makes it possible to produce an SGT having stable characteristics.

What is claimed is:

1. A method of producing a semiconductor device in which a source diffusion layer, a drain diffusion layer and a pillar-shaped semiconductor layer are vertically arranged on an upper side of a substrate in a layered manner, and a gate is arranged around a sidewall of the pillar-shaped semiconductor layer, wherein the pillar-shaped semiconductor layer is arranged on a semiconductor substrate, the pillar-shaped semiconductor layer has a third protective film formed on a top thereof, and a dielectric film is arranged on respective surfaces of the semiconductor substrate and the pillar-shaped semiconductor layer, the method comprising the steps of:
   forming a first gate conductive film to cover a surface of the dielectric film;
   forming, on a surface of the first gate conductive film, a second gate conductive film having a plasma emission characteristic different from that of the first gate conductive film;
   flattening respective upper portions of the first and second gate conductive films by CMP, the third protective film being used as a stopper of CMP; and
   anisotropically etching the first and second gate conductive films, wherein an intensity of plasma emission generated from the second gate conductive film is monitored during the etching to detect a change in the plasma emission intensity occurring when the second gate conductive film is etched away, to thereby detect an end-point of the etching for the first and second gate conductive films.

2. A method of producing a semiconductor device in which a source diffusion layer, a drain diffusion layer and a pillar-shaped semiconductor layer are vertically arranged on an upper side of a substrate in a layered manner, and a gate is arranged around a sidewall of the pillar-shaped semiconductor layer, wherein the pillar-shaped semiconductor layer is arranged on a semiconductor substrate, the pillar-shaped semiconductor layer has a third protective film formed on a top thereof, and a dielectric film is arranged on respective surfaces of the semiconductor substrate and the pillar-shaped semiconductor layer, the method comprising the steps of:
   forming a first gate conductive film to cover a surface of the dielectric film;
   forming, on a surface of the first gate conductive film, a second gate conductive film having a plasma emission characteristic different from that of the first gate conductive film;
   forming, on a surface of the second gate conductive film, a third gate conductive film having a plasma emission characteristic different from that of the second gate conductive film;
   flattening respective upper portions of the first, second and third gate conductive films by CMP, the third protective film being used as a stopper of CMP; and
   anisotropically etching the first, second and third gate conductive films,
   wherein the second gate conductive film is formed to become thinner than the first and third gate conductive films, and an intensity of plasma emission generated from the second gate conductive film is monitored during the etching to detect a change in the plasma emission intensity occurring when the second gate conductive film is etched away, to thereby detect an end-point of the etching for the first, second and third gate conductive films.

3. The method as defined in claim 2, wherein the first gate conductive film and the third gate conductive film are made of an identical material.

* * * * *